United States Patent
Briggs et al.

(10) Patent No.: US 10,312,434 B2
(45) Date of Patent: Jun. 4, 2019

(54) SELECTIVE DEPOSITION AND NITRIDIZATION OF BOTTOM ELECTRODE METAL FOR MRAM APPLICATIONS

(71) Applicant: INTERNATIONAL BUSINESS MACHINES CORPORATION, Armonk, NY (US)

(72) Inventors: Benjamin D. Briggs, Waterford, NY (US); Joe Lee, Albany, NY (US); Christopher J. Penny, Saratoga Springs, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/805,882

(22) Filed: Nov. 7, 2017

(65) Prior Publication Data
US 2018/0240971 A1    Aug. 23, 2018

Related U.S. Application Data

(63) Continuation of application No. 15/436,001, filed on Feb. 17, 2017.

(51) Int. Cl.
*H01L 27/22* (2006.01)
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC ... H01L 27/222; H01L 27/226; H01L 27/228; H01L 29/82
See application file for complete search history.

(56) References Cited

U.S. PATENT DOCUMENTS

| 2,829,059 A | 4/1958 | Eisenbertg et al. |
| 6,801,415 B2 | 10/2004 | Slaughter et al. |
| 6,828,639 B2 | 12/2004 | Nejad et al. |
| (Continued) | | |

FOREIGN PATENT DOCUMENTS

WO    2015/134206 A1    9/2015

OTHER PUBLICATIONS

Bhandari et al., "Chemical Vapor Deposition of Cobalt Nitride and its Application as an Adhesion-Enhancing Layer for Adviance Copper Interconnects", ECS Journal of Solid State Science and Technology. vol. 1, No. 5. Sep. 5, 2012. pp. N79-N84.

(Continued)

*Primary Examiner* — Jae Lee
(74) *Attorney, Agent, or Firm* — Tutunjian & Bitetto, P.C.; Vazken Alexanian

(57) ABSTRACT

A method is presented for forming a semiconductor structure. The method includes depositing an insulating layer over a semiconductor substrate, etching the insulating layer to form trenches for receiving a metal, depositing one or more sacrificial layers, and etching portions of the one or more sacrificial layers to expose a top surface of the metal of one or more of the trenches. The method further includes selectively depositing an electrode over the top surface of the exposed metal and nitridizing the electrode to form a diffusion barrier between chip components and the metal.

14 Claims, 6 Drawing Sheets

(56) References Cited

U.S. PATENT DOCUMENTS

| | | | |
|---|---|---|---|
| 6,844,258 B1* | 1/2005 | Fair | H01L 21/76849 |
| | | | 257/650 |
| 8,013,446 B2* | 9/2011 | Yang | H01L 21/76843 |
| | | | 257/758 |
| 8,237,149 B2 | 8/2012 | Oh et al. | |
| 8,264,053 B2 | 9/2012 | Tsukamoto et al. | |
| 8,461,684 B2 | 6/2013 | Gordon et al. | |
| 8,674,465 B2 | 3/2014 | Li et al. | |
| 9,190,260 B1 | 11/2015 | Zhang et al. | |
| 2001/0025797 A1* | 10/2001 | Klein | C23C 8/02 |
| | | | 205/125 |
| 2015/0255339 A1 | 9/2015 | Zhang et al. | |
| 2015/0325622 A1* | 11/2015 | Zhang | H01L 43/12 |
| | | | 257/421 |
| 2016/0099287 A1 | 4/2016 | Nagamine et al. | |
| 2017/0084819 A1* | 3/2017 | Lu | H01L 43/02 |
| 2017/0092693 A1* | 3/2017 | Tan | H01L 27/228 |
| 2017/0179378 A1* | 6/2017 | Kar | H01L 43/08 |

OTHER PUBLICATIONS

Green et al., "Structure of Selective Low Pressure Chemically Vapor-Deposited Films of Tungsten", Journal of Electrochemical Society, vol. 132, No. 5. May 1, 1985, pp. 1243-1250.

Levy et al., "Selective SPCVD Tungsten for Contact Barrier Applications", Journal of Electrochemical Society. vol. 133, No. 9. Sep. 1, 1986. pp. 1905-1912.

List of IBM Patents or Patent Applications Treated as Related dated Nov. 7, 2017, 2 pages.

* cited by examiner

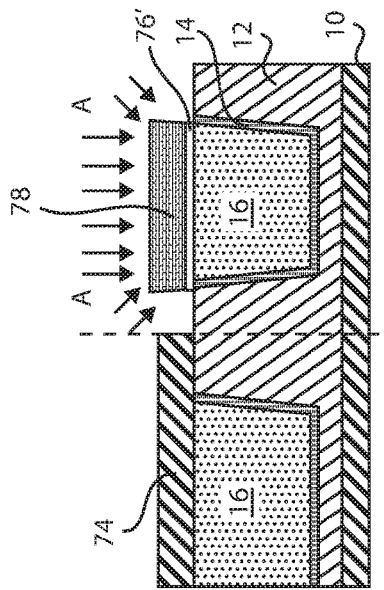
FIG. 13
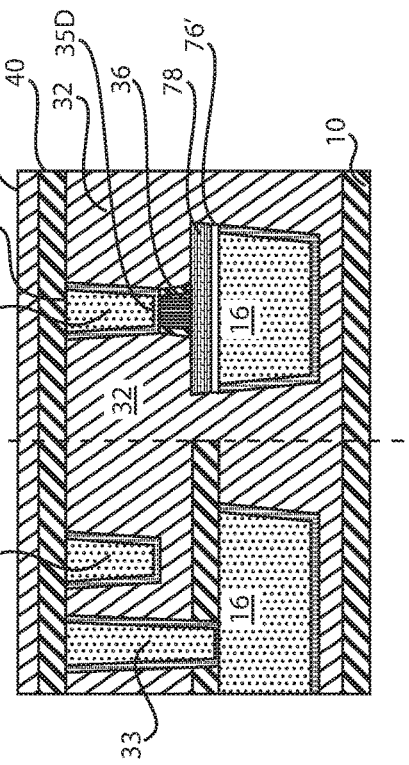
FIG. 14
FIG. 16
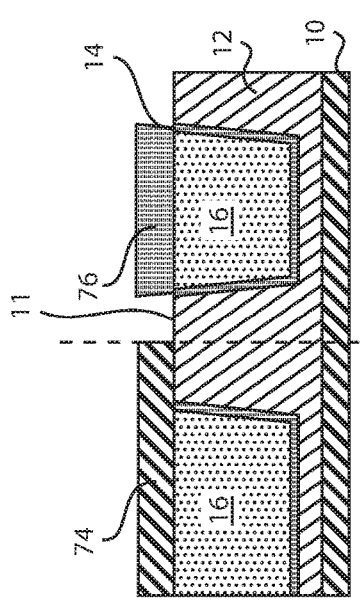
FIG. 15

SELECTIVE DEPOSITION AND NITRIDIZATION OF BOTTOM ELECTRODE METAL FOR MRAM APPLICATIONS

BACKGROUND

Technical Field

The present invention relates generally to semiconductor devices, and more specifically, to the selective deposition and nitridization of a bottom electrode metal for at least magnetic random access memory (MRAM) applications.

Description of the Related Art

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to effects such as electromigration.

SUMMARY

In accordance with an embodiment, a method is provided for forming a semiconductor structure. The method includes depositing an insulating layer over a semiconductor substrate, etching the insulating layer to form trenches for receiving a metal, depositing one or more sacrificial layers, etching portions of the one or more sacrificial layers to expose a top surface of the metal of one or more of the trenches, selectively depositing an electrode over the top surface of the exposed metal, and nitridizing the electrode to form a barrier between chip components and the metal.

In accordance with an embodiment, a method is provided for forming a semiconductor structure. The method includes depositing an insulating layer over a semiconductor substrate, etching the insulating layer to form trenches for receiving a metal, depositing one or more sacrificial layers, etching portions of the one or more sacrificial layers to expose a top surface of the metal of one or more of the trenches, selectively recessing the exposed metal of one or more of the trenches, selectively depositing an electrode within the recessed portion of the exposed metal, and nitridizing the electrode to form a barrier between chip components and the metal.

In accordance with another embodiment, a semiconductor device is provided. The semiconductor device includes an insulating layer formed over a semiconductor substrate, trenches configured to receive a metal, the trenches formed by etching the insulating layer, one or more sacrificial layers selectively etched to expose a top surface of the metal of one or more of the trenches, and an electrode selectively deposited over the top surface of the exposed metal, the electrode nitridized to form a barrier between chip components and the metal.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 13 is a cross-sectional view of a semiconductor device where a thick blocking mask and a thick bottom metal electrode are deposited, in accordance with another embodiment of the present invention;

FIG. 14 is a cross-sectional view of the semiconductor device of FIG. 13 where the bottom metal electrode is nitridized, in accordance with another embodiment of the present invention;

FIG. 15 is a cross-sectional view of the semiconductor device of FIG. 14 where the selective dielectric deposition takes place to fill regions adjacent the nitridized bottom metal electrode, in accordance with another embodiment of the present invention;

FIG. 16 is a cross-sectional view of the semiconductor device of FIG. 15 where a blocking boundary is created over the nitridized Cu region and vias/trenches are formed that are aligned with the blocking boundary, in accordance with another embodiment of the present invention.

Throughout the drawings, same or similar reference numerals represent the same or similar elements.

DETAILED DESCRIPTION

Figure 1:
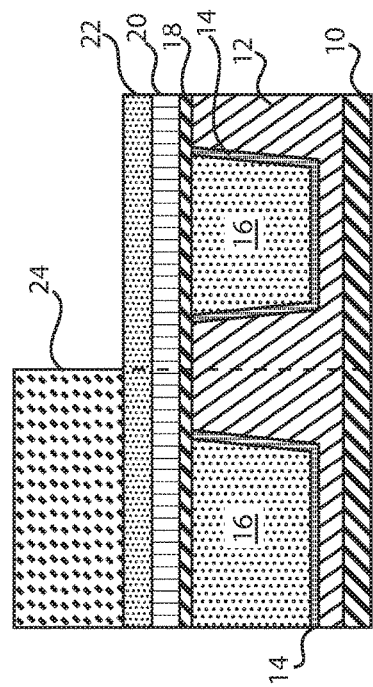
FIG. 1 is a cross-sectional view of a semiconductor structure including copper (Cu) received within recessed regions of an insulator deposited over a semiconductor substrate, in accordance with an embodiment of the present invention.

In one or more embodiments, a method is provided for forming a semiconductor structure. The method includes depositing an insulating layer over a semiconductor substrate, etching the insulating layer to form trenches for receiving a metal, depositing one or more sacrificial layers, etching portions of the one or more sacrificial layers to expose a top surface of the metal of one or more of the trenches, selectively depositing an electrode over the top surface of the exposed metal, and nitridizing the electrode to form a barrier between chip components and the metal.

In one or more embodiments, a method is provided for forming a semiconductor structure. The method includes depositing an insulating layer over a semiconductor substrate, etching the insulating layer to form trenches for receiving a metal, depositing one or more sacrificial layers, etching portions of the one or more sacrificial layers to expose a top surface of the metal of one or more of the trenches, selectively recessing the exposed metal of one or more of the trenches, selectively depositing an electrode within the recessed portion of the exposed metal, and nitridizing the electrode to form a barrier between chip components and the metal.

In one or more embodiments, a semiconductor device is provided. The semiconductor device includes an insulating layer formed over a semiconductor substrate, trenches configured to receive a metal, the trenches formed by etching the insulating layer, one or more sacrificial layers selectively etched to expose a top surface of the metal of one or more of the trenches, and an electrode selectively deposited over the top surface of the exposed metal, the electrode nitridized to form a barrier between chip components and the metal.

In one or more embodiments, the blocking boundary can be created directly underneath the via/trench, whereas in other embodiments the blocking boundary can be created in an area or region surrounding the via/trench.

In one or more embodiments, a blocking boundary is only placed where needed (i.e., not under all the vias). As a result, the via resistance can be very low for critical circuits where a blocking boundary is not necessary. The blocking boundary does not impact trench resistance or capacitance since the blocking boundary is limited to select vias.

In one or more embodiments, a structure and method are introduced to integrate a self-aligned metal bottom electrode and nitridize it to form a barrier in specific regions of the chip, while leaving other logic regions largely unchanged. Such a structure and method is achieved by blocking out non-MTJ (magnetic tunnel junction) regions of the chip and leaving a sacrificial dielectric cap to protect areas designed to remain unmodified. Additionally, selective deposition of a metal on top of the bottom contact (no additional critical mask or Cu recess required) and nitridation of a selective metal to form effective barrier is achieved.

In one or more embodiments, selective deposition of a metal that is not a barrier by itself is followed by a nitridization process to impart barrier properties. The selective deposition would be electroless (wet) for certain metal (e.g., tantalum) or would be a selective chemical vapor deposition (CVD) (dry) for certain metals (e.g., cobalt).

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, the term "silicide" is an alloy of a metal and silicon.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this invention, contact and via refer to the completed structure.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The terms "gas" and "gases" are used interchangeably, unless otherwise noted, and refer to one or more precursors, reactants, catalysts, carrier, purge, cleaning, combinations thereof, as well as any other fluid introduced into the chamber body.

As used herein, a surface is "substantially planar" if the surface is intended to be planar and the non-planarity of the surface is limited by imperfections inherent in the processing steps that are employed to form the surface.

As used herein, a "mounting structure" is any structure to which a semiconductor chip can be mounted by making electrical connections thereto. A mounting structure can be a packaging substrate, an interposer structure, or another semiconductor chip.

The semiconductor devices described herein can be any type of device. Exemplary types of semiconductor devices include planar field effect transistors (FETs), fin-type field effect transistors (FinFETs), nanowire/nanosheet devices, vertical field effect transistors (VFETs), or other devices.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including copper (Cu) received within recessed regions of an insulator deposited over a semiconductor substrate, in accordance with an embodiment of the present invention.

A semiconductor structure 5 includes a semiconductor substrate 10. An insulator layer 12 is deposited over the substrate 10. The insulating layer 12 is etched to form trenches thereon. A tantalum nitride (TaN) liner 14 or in the alternative a tantalum (Ta) liner 14 is deposited over or around the trenches. In one example embodiment, the conductive fill material 14 can be deposited, for example, by electroplating, electroless plating, chemical vapor deposition (CVD), atomic layer deposition (ALD) and/or physical vapor deposition (PVD).

The trenches are then configured to receive a conducting material. The conducting material can be a metal, such as copper (Cu) 16. A top surface 15 of the copper regions 16 can be exposed. In the exemplary embodiment, two Cu regions 16 are illustrated for the sake of clarity. One skilled in the art may contemplate a plurality of Cu regions 16 defined within the insulator layer 12. Additionally, a top surface 11 of the insulating layer 12 is exposed between the Cu regions 16.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10 including high-k oxides and/or nitrides. In one or more embodiments, the substrate 10 can be a silicon wafer. In an embodiment, the substrate 10 is a single crystal silicon wafer.

Figure 2:
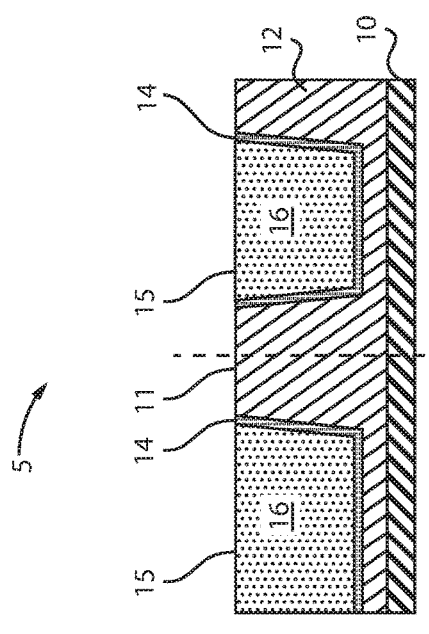
FIG. 2 is a cross-sectional view of the semiconductor structure of FIG. 1 where sacrificial layers are deposited over the Cu regions, in accordance with an embodiment of the present invention.

FIG. 2 is a cross-sectional view of the semiconductor structure of FIG. 1 where sacrificial layers are deposited over the Cu regions, in accordance with an embodiment of the present invention.

In various embodiments, a first sacrificial layer 18, a second sacrificial layer 20, and an oxide 22 are deposited over the Cu regions 16, as well as the exposed portions of the insulator 12. Additionally, a photoresist 24 is used in the lithography, which defines the location desired to form the blocking boundary. Photoresist 24 is deposited over one of the Cu regions 16. The first sacrificial layer 18 can be, e.g., silicon nitride (SiN) or a dielectric cap. The second sacrificial layer 20 can be, e.g., SiN or a metal nitride.

In some embodiments, depositing the SiN layer 18 comprises exposing the metal nitride film to a first deposition gas and a second deposition gas, either simultaneously (e.g., CVD) or sequentially (e.g., ALD). The first deposition gas can comprise any suitable silicon-containing precursor and the second deposition gas can comprise any suitable reactive gas capable of reacting with the first deposition gas. In some embodiments, the first deposition gas comprises disilane and a second deposition gas comprises ammonia and exposing the plasma treated metal nitride film to the deposition gases forms a metal-SiN film.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 3:
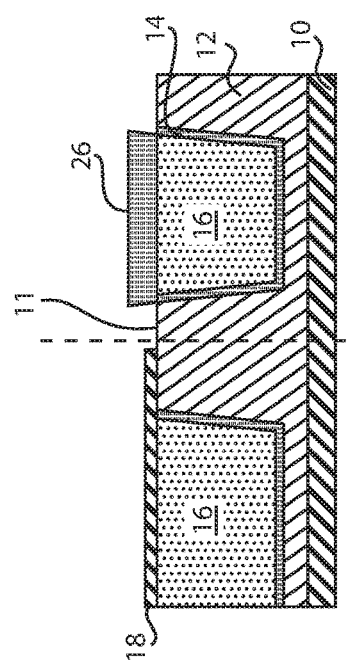
FIG. 3 is a cross-sectional view of the semiconductor device of FIG. 2 where a portion of the sacrificial layers are removed by, e.g., reactive-ion etching (RIE) to expose a top surface of one or more of the Cu regions, in accordance with an embodiment of the present invention.

FIG. 3 is a cross-sectional view of the semiconductor device of FIG. 2 where a portion of the sacrificial layers are removed by, e.g., reactive-ion etching (RIE) to expose a top surface of one or more of the Cu regions, in accordance with an embodiment of the present invention.

In various embodiments, the photoresist 24 and the oxide layer 22 are selectively etched. Additionally, the first and second sacrificial layers 18, 20 not positioned under the photoresist 24 are etched to expose the top surface 15 of the Cu region 16 (right-hand side), as well as the top surface 11 of the insulating layer 12. In contrast, the first and second sacrificial layers 18, 20 positioned under the photoresist 24 remain intact on the other Cu region 16 (left-hand side).

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process. In one example embodiment, RIE is performed.

Concerning removal of the oxide, plasma processes commonly use nitrogen gas ($N_2$) for dilution, nitrous oxide ($N_2O$) as an oxygen carrying gas, and silane ($SiH_4$) as a silicon carrying gas. In the plasma phase these compounds are dissociated into their respective ionic components and the more mobile electrons are accelerated by high frequency RF at high power coupled to the reaction chamber to strike the plasma. There is a small negative voltage between the positive ions in the plasma and the wafer that rests on a grounded heater block. This potential difference will accelerate the ions towards the wafer surface where the ions form a layer of silicon dioxide ($SiO_2$).

High and low frequency RF power is commonly used in oxide reactors to enhance the LPCVD process. High frequency RF power is used to strike the plasma by accelerating the electrons, whereas low frequency RF power is used to enhance the densification of the layer to be formed as it keeps heavier ions mobile for an extended time.

Figure 4:
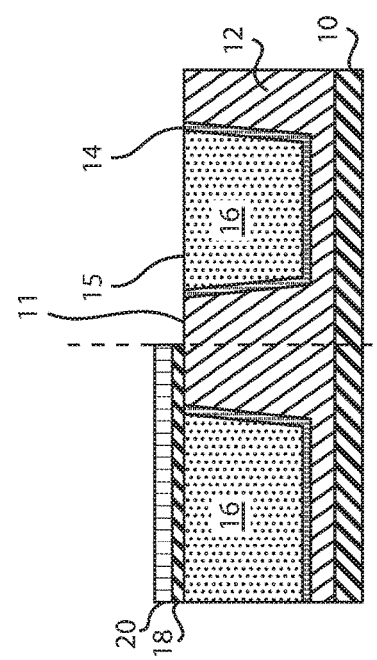
FIG. 4 is a cross-sectional view of the semiconductor device of FIG. 3 where a bottom metal electrode is deposited, in accordance with an embodiment of the present invention.

FIG. 4 is a cross-sectional view of the semiconductor device of FIG. 3 where a bottom metal electrode is deposited, in accordance with an embodiment of the present invention.

In various embodiments, a conducting material 26 is deposited over the exposed Cu region 16. Also, the second sacrificial layer 20 is stripped to reveal only the first sacrificial material 18. The conducting material 26 can be a metal. The metal can be a bottom metal electrode. The bottom metal electrode 26 can be, e.g., tantalum (Ta), cobalt (Co), ruthenium (Ru), manganese (Mn), tungsten (W), and molybdenum (Mo). However, if electroless deposition takes place, then the metal could also be, e.g., chromium (Cr), nickel (Ni), CoWP (cobalt tungsten phosphorus), and NiWP (nickel tungsten phosphorus). Thus, the bottom metal electrode 26 is deposited over the exposed Cu region 16 (right-hand side) and the first sacrificial material 18 remains over the other Cu region 16 (left-hand side).

Among the various metal liners for copper (Cu) interconnect technology, tantalum-based (Ta) materials are one of the most widely used because they provide high thermal and mechanical stability and diffusion barrier properties, and good adhesion, all of which result in good reliability. Sputtered tantalum (Ta) and reactive sputtered tantalum nitride (TaN) have been demonstrated to be good diffusion barriers between copper and a silicon substrate due to their high conductivity, high thermal stability, and resistance to diffusion of foreign atoms.

Ion-induced atomic layer deposition (iALD) is one process for depositing TaN. iALD is an example of a plasma-assisted deposition process. Another plasma-assisted deposition process is plasma-enhanced chemical vapor deposition (PECVD). iALD processes can produce TaN layers having a higher density (e.g., about 13 to 14 $g/cm^3$) compared to the density of TaN layers produced with other methods. For example, thermal atomic layer deposition (ALD) commonly produces TaN layers with a density of about 8 to 9 $g/cm^3$. iALD TaN layers also can have a higher conductivity and lower resistivity than thermal ALD TaN layers. iALD processes can have other advantages, including providing very conformal layers, a precise control of the thickness of these layers, the ability to vary the layer composition, and the ability to engineer the surface of the layer to improve the adhesion of a subsequent layer.

Figure 5:
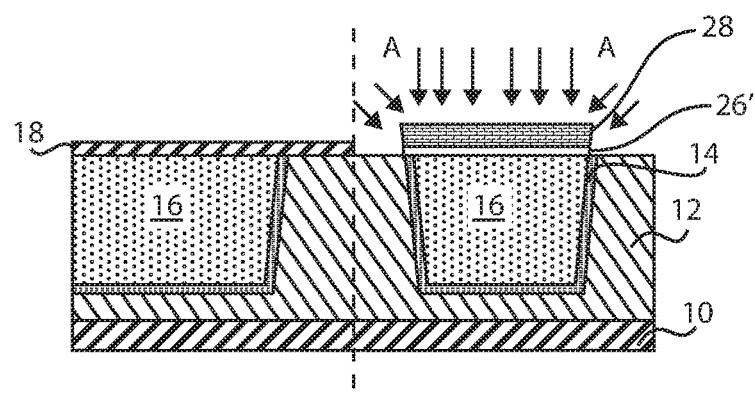
FIG. 5 is a cross-sectional view of the semiconductor device of FIG. 4 where the bottom metal electrode is nitridized, in accordance with an embodiment of the present invention.

FIG. 5 is a cross-sectional view of the semiconductor device of FIG. 4 where the bottom metal electrode is nitridized, in accordance with an embodiment of the present invention.

In various embodiments, the top surface of the bottom metal electrode 26 is nitridized, as shown by the arrows "A." As such, a metal-nitride cap 28 is formed over the remaining bottom metal electrode 26'.

Figure 6:
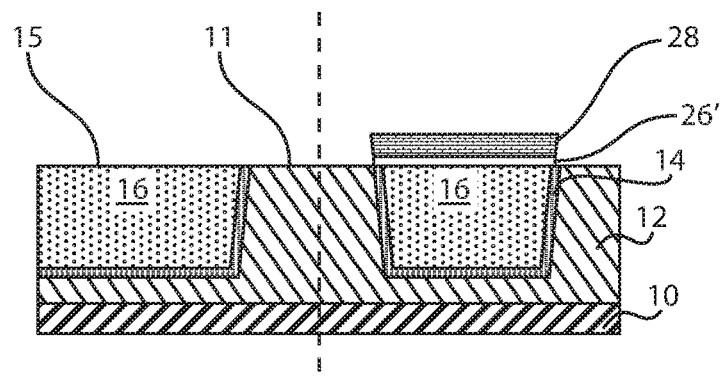
FIG. 6 is a cross-sectional view of the semiconductor device of FIG. 5 where the remaining sacrificial layer is stripped and chemical-mechanical planarization (CMP) is performed, in accordance with an embodiment of the present invention.

FIG. 6 is a cross-sectional view of the semiconductor device of FIG. 5 where the remaining sacrificial layer is stripped and chemical-mechanical planarization (CMP) is performed, in accordance with an embodiment of the present invention.

In various embodiments, the remaining sacrificial layer 18 is stripped to expose a top surface 15 of the Cu region 16. Thus, one Cu region 16 (right-hand side) is shown with a metal-nitride cap 28 formed thereon and another Cu region 16 (left-hand side) is shown with its top surface exposed. The metal-nitride cap 28 can be referred to as a conductive cap or a blocking boundary. The Cu regions 16 have a thickness greater than the thickness of the blocking boundary 28.

Figure 7:
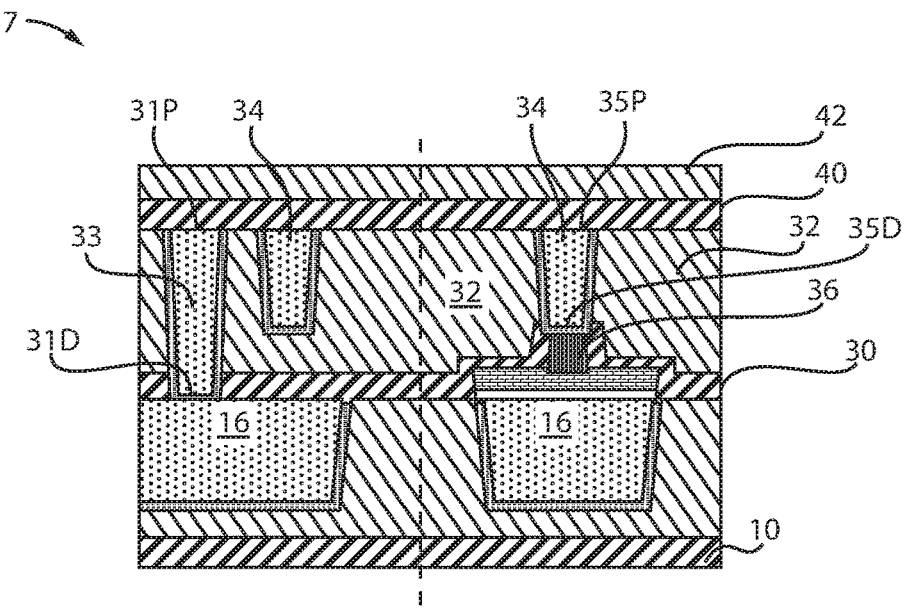
FIG. 7 is a cross-sectional view of the semiconductor device of FIG. 6 where a blocking boundary is created over the nitridized Cu region and vias/trenches are formed that are aligned with the blocking boundary, in accordance with an embodiment of the present invention.

FIG. 7 is a cross-sectional view of the semiconductor device of FIG. 6 where a blocking boundary is created over the nitridized Cu region and vias/trenches are formed that are aligned with the blocking boundary, in accordance with an embodiment of the present invention.

In various embodiments, a dielectric cap layer 30 is formed over the Cu regions 16. The dielectric cap 30 hermetically seals the metal below from moisture and/or oxygen. The dielectric cap 30 also acts as a Cu diffusion barrier, thus preventing Cu from escaping into the ILD above an insulator 32.

The insulator 32 is deposited over the dielectric cap 30. A plurality of vias and trenches are subsequently formed that extend through the insulator 32. A via 33 has a proximal end 31P and a distal end 31D. The distal end 31D of the via 33 extends to the top surface 15 of the Cu region 16.

A trench 34 has a proximal end 35P and a distal end 35D. The distal end 35D of the trench 34 extends to a top surface of the magnetic tunnel junction (MTJ) 36. The MTJ 36 is formed over the blocking boundary 28. Additionally, several other trenches 34 can be formed within the insulator 32 such that they extend a certain length therewith. The via 33 extends into the dielectric cap 30.

The via 33 is self-aligned with the Cu region 16 (left-hand side) and the trench 34 is optionally self-aligned with the blocking boundary 28 and with the Cu region 16 (right-hand side). Stated differently, a longitudinal axis (not shown) extends through the center point of the trench 34, the blocking boundary 28, and the Cu region 16. Additionally, a first dielectric cap 40 and a second dielectric cap 42 can be formed over the via 33 and the trenches 34.

The dielectric caps 40, 42 can be deposited, planarized, and etched back. The dielectric caps 40, 42 can be, e.g., a nitride film. In an embodiment, the dielectric caps 40, 42 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization processes can include grinding and polishing.

In one or more embodiments, the dielectric caps 40, 42 can have a thickness in the range of about 3 nm to about 30 nm.

The dielectric caps 40, 42 can be deposited, planarized, and etched back so that the dielectric caps 40, 42 extend across all the proximal ends of the vias 33 and trenches 34. The final structure is designated as structure 7.

Figure 8:
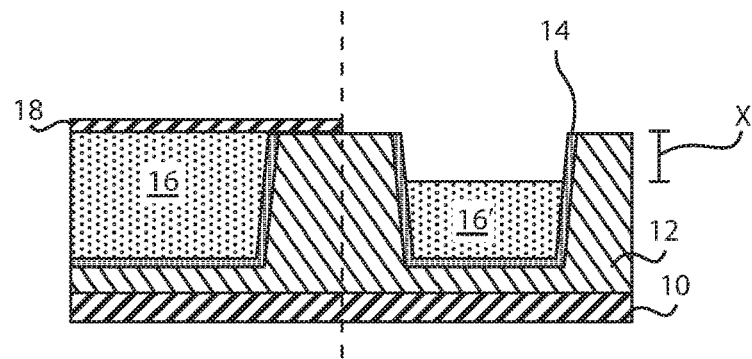
FIG. 8 is a cross-sectional view of the semiconductor device of FIG. 3 where the exposed Cu region is recessed, in accordance with another embodiment of the present invention.

FIG. 8 is a cross-sectional view of the semiconductor device of FIG. 3 where the exposed Cu region is recessed, in accordance with another embodiment of the present invention.

In various embodiments, after selective etching is performed, as shown in FIG. 3, the Cu region 16 is recessed. The recessed Cu region 16' can be accomplished by, e.g., wet etching. The Cu region 16' can be recessed by a distance "X." The Cu region 16 can be recessed by, for example, by forming copper oxide and removing with a DHF (dilute hydrofluoric acid) solution.

Figure 9:
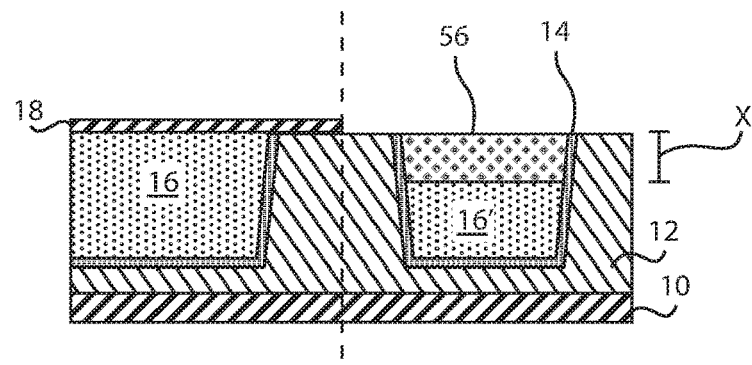
FIG. 9 is a cross-sectional view of the semiconductor device of FIG. 8 where the recessed Cu region is filled with a metal to create a bottom metal electrode, in accordance with an embodiment of the present invention.

FIG. 9 is a cross-sectional view of the semiconductor device of FIG. 8 where the recessed Cu region is filled with a metal to create a bottom metal electrode, in accordance with an embodiment of the present invention.

In various embodiments, a conducting material 56 is deposited within the recess of the Cu region 16'. The conducting material 56 can be a metal. The metal can be a bottom metal electrode. The bottom metal electrode 56 can be, e.g., tantalum (Ta), cobalt (Co), ruthenium (Ru), manganese (Mn), tungsten (W), and molybdenum (Mo). However, if electroless deposition takes place, then the metal 56 could also be, e.g., chromium (Cr), nickel (Ni), CoWP (cobalt tungsten phosphorus), and NiWP (nickel tungsten phosphorus).

Figure 10:
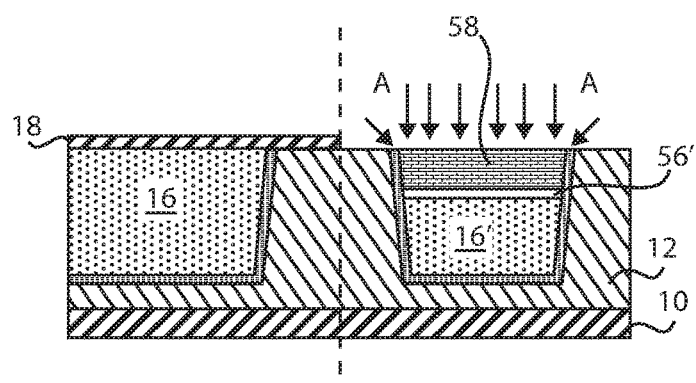
FIG. 10 is a cross-sectional view of the semiconductor device of FIG. 9 where the bottom metal electrode is nitridized, in accordance with an embodiment of the present invention.

FIG. 10 is a cross-sectional view of the semiconductor device of FIG. 9 where the bottom metal electrode is nitridized, in accordance with an embodiment of the present invention.

In various embodiments, the top surface of the bottom metal electrode 56 is nitridized, as shown by the arrows "A." As such, a metal-nitride cap 58 is formed over the remaining bottom metal electrode 56'.

Figure 11:
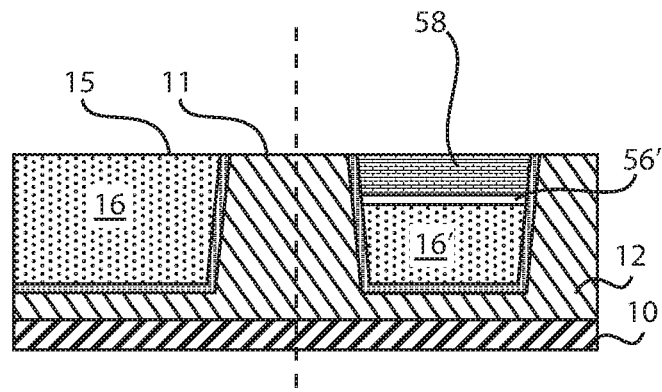
FIG. 11 is a cross-sectional view of the semiconductor device of FIG. 10 where the remaining sacrificial layer is stripped and chemical-mechanical planarization (CMP) is performed, in accordance with an embodiment of the present invention.

FIG. 11 is a cross-sectional view of the semiconductor device of FIG. 10 where the remaining sacrificial layer is stripped and chemical-mechanical planarization (CMP) is performed, in accordance with an embodiment of the present invention.

In various embodiments, the remaining sacrificial layer 18 is stripped to expose a top surface 15 of the Cu region 16. Thus, one Cu region 16' is shown with a metal-nitride cap 58 formed thereon and another Cu region 16 is shown with its top surface 15 exposed. The metal-nitride cap 58 can be referred to as a conductive cap or a blocking boundary. The Cu regions 16, 16' have a thickness greater than the thickness of the blocking boundary 58. The blocking boundary 58 can have a greater thickness than the blocking boundary 26' of FIGS. 5-7.

Figure 12:
FIG. 12 is a cross-sectional view of the semiconductor device of FIG. 11 where a blocking boundary is created over the recessed and nitridized Cu region and vias/trenches are formed that are aligned with the blocking boundary, in accordance with an embodiment of the present invention.
Figure 12:
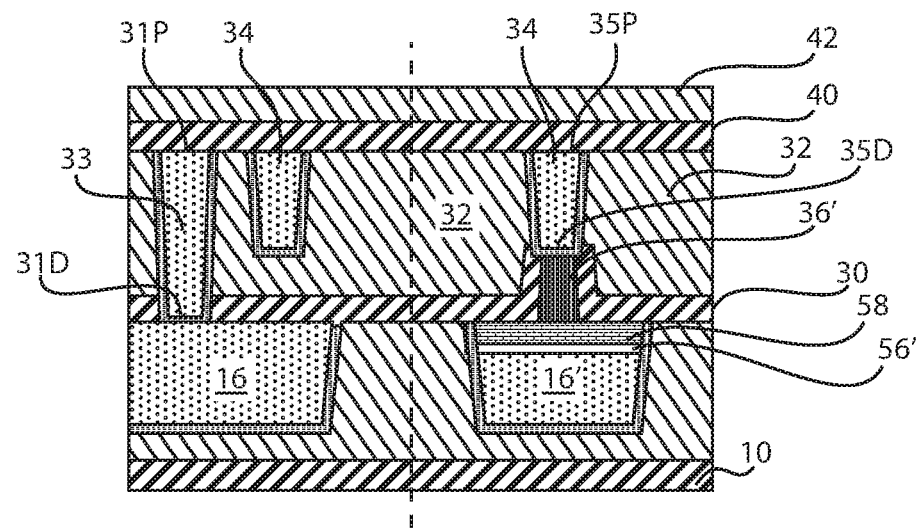

FIG. 12 is a cross-sectional view of the semiconductor device of FIG. 11 where a blocking boundary is created over the recessed and nitridized Cu region and vias/trenches are formed that are aligned with the blocking boundary, in accordance with an embodiment of the present invention.

In various embodiments, a dielectric cap layer 30 is formed over the Cu regions 16, 16'. The dielectric cap 30 hermetically seals the metal below from moisture and/or oxygen. The dielectric cap 30 also acts as a Cu diffusion barrier, thus preventing Cu from escaping into the ILD above an insulator 32.

The insulator 32 is deposited over the dielectric cap 30. A plurality of vias and trenches are subsequently formed that extend through the insulator 32. A via 33 has a proximal end 31P and a distal end 31D. The distal end 31D of the via 33 extends to the top surface 15 of the Cu region 16.

A trench 34 has a proximal end 35P and a distal end 35D. The distal end 35D of the trench 34 extends to a top surface of the magnetic tunnel junction (MTJ) 36'. The MTJ 36' is formed over the blocking boundary 58. Additionally, several other trenches 34 can be formed within the insulator 32 such that they extend a certain length therewith. The via 33 extends into the dielectric cap 30.

The via 33 is self-aligned with the Cu region 16 and the trench 34 is self-aligned with the blocking boundary 58 and with the Cu region 16'. Stated differently, a longitudinal axis (not shown) extends through the center point of the trench 34, the blocking boundary 58, and the Cu region 16'. Additionally, a first dielectric cap 40 and a second dielectric cap 42 can be formed over the via 33 and the trenches 34.

The dielectric caps 40, 42 can be deposited, planarized, and etched back. The dielectric caps 40, 42 can be, e.g., a nitride film. In an embodiment, the dielectric caps 40, 42 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the dielectric caps 40, 42 can have a thickness in the range of about 3 nm to about 30 nm.

The dielectric caps 40, 42 can be deposited, planarized, and etched back so that the dielectric caps 40, 42 extend across all the proximal ends of the vias 33 and trenches 34. The final structure is designated as structure 9.

Regarding the metal deposition in structure 7 (FIG. 7) and structure 9 (FIG. 12), the selective deposition can be cyclic with nitridization steps in between pure metal depositions to give a metal nitride. Nitridation allows the metal to form an effective barrier between the Cu regions and the MTJ stacks.

FIG. 13 is a cross-sectional view of a semiconductor device where a thick blocking mask and a thick bottom metal electrode are deposited, in accordance with another embodiment of the present invention.

In various embodiments, a thicker sacrificial layer 74 can be used as a blocking mask over one of the Cu regions 16. Additionally, a thicker bottom metal electrode 76 can be used over another of the Cu regions 16.

The bottom metal electrode 76 can be, e.g., tantalum (Ta), cobalt (Co), ruthenium (Ru), manganese (Mn), tungsten (W), and molybdenum (Mo). However, if electroless deposition takes place, then the metal 76 could also be, e.g., chromium (Cr), nickel (Ni), CoWP (cobalt tungsten phosphorus), and NiWP (nickel tungsten phosphorus).

FIG. 14 is a cross-sectional view of the semiconductor device of FIG. 13 where the bottom metal electrode is nitridized, in accordance with another embodiment of the present invention.

In various embodiments, the top surface of the bottom metal electrode 76 is nitridized, as shown by the arrows "A." As such, a metal-nitride cap 78 is formed over the remaining bottom metal electrode 76'.

FIG. 15 is a cross-sectional view of the semiconductor device of FIG. 14 where the selective dielectric deposition takes place to fill regions adjacent the nitridized bottom metal electrode, in accordance with another embodiment of the present invention.

In various embodiments, further dielectric 12' can be selectively deposited adjacent the metal-nitride cap 78 such that the dielectric 12' extends to a top surface of the metal-nitride cap 78, as well as to a top surface of the sacrificial layer 74. The dielectric 12' can be deposited, planarized, and etched back to be coplanar with the top surfaces of the metal-nitride cap 78 and the sacrificial layer 74. The planarization process can be provided by chemical mechanical planarization (CMP). Other planarization process can include grinding and polishing.

FIG. 16 is a cross-sectional view of the semiconductor device of FIG. 15 where a blocking boundary is created over the nitridized Cu region and vias/trenches are formed that are aligned with the blocking boundary, in accordance with another embodiment of the present invention.

In various embodiments, an insulator 32 is further deposited over the metal-nitride cap 78 and the sacrificial layer 74. A plurality of vias and trenches are subsequently formed that extend through the insulator 32. For example, a via 33 extends to the top surface 15 of the Cu region 16 (left-hand side).

A trench 34 has a proximal end 35P and a distal end 35D. The distal end 35D of the trench 34 extends to a top surface of the magnetic tunnel junction (MTJ) 36. The MTJ 36 is formed over the blocking boundary 78. Additionally, several other trenches 34 can be formed within the insulator 32 such that they extend a certain length therewith. The via 33 extends up to a top surface of the Cu region 16 (left-hand side).

The via 33 is self-aligned with the Cu region 16 and the trench 34 is self-aligned with the blocking boundary 78 and with the Cu region 16 (right-hand side). Stated differently, a longitudinal axis (not shown) extends through the center point of the trench 34, the blocking boundary 78, and the Cu region 16. Additionally, a first dielectric cap 40 and a second dielectric cap 42 can be formed over the via 33 and the trenches 34, as described above in detail. The dielectric caps 40, 42 can be deposited, planarized, and etched back. The final structure is designated as structure 80.

Figure 17:
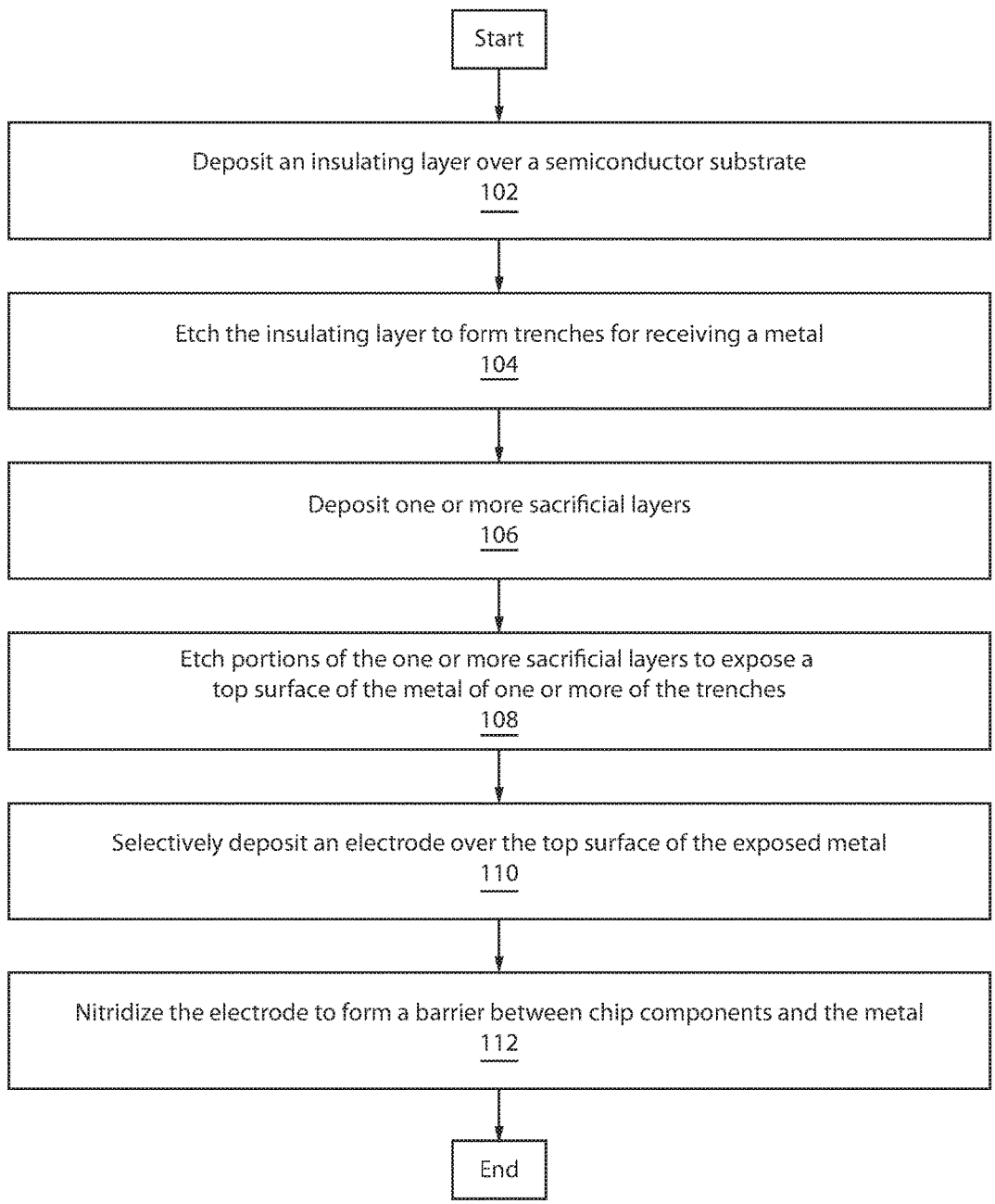
FIG. 17 is a block/flow diagram of an exemplary method for forming a semiconductor device, in accordance with an embodiment of the present invention.

FIG. 17 is a block/flow diagram of an exemplary method for forming a semiconductor device, in accordance with an embodiment of the present invention.

At block 102, an insulating layer is deposited over a semiconductor substrate.

At block 104, the insulating layer is etched to form trenches for receiving a metal.

At block 106, one or more sacrificial layers are deposited.

At block 108, portions of the one or more sacrificial layers are etched to expose a top surface of the metal of one or more of the trenches.

At block 110, an electrode is selectively deposited over the top surface of the exposed metal.

At block 112, the electrode is nitridized to form a barrier between chip components and the metal.

In summary, a method is presented to enable a self-aligned metal bottom electrode for magnetic tunnel junctions (MTJs) by using a block mask to separate out processing between MTJ and non-MTJ regions, by selective metal deposition on exposed copper (Cu), and by nitridization of selective metal cap to form a proper barrier. The advantages of the exemplary embodiments of the present invention include (i) reduction in the cost of masks required for MTJ integration (no bottom electrode critical dimension (CD) mask required), (ii) selective deposition allows self-alignment to avoid concerns over overlay tolerances at that step, and (iii) nitridization allows for effective barrier formation, and adjustments without requiring new physical vapor deposition (PVD) targets.

The exemplary embodiments of the present invention avoid these aforementioned issues by allowing for the creation of localized or selective self-aligned metal caps or blocking boundaries atop of interconnects. Thus, the exemplary embodiments of the present invention apply the metal cap only in certain regions of interest on the chip. The metal caps prevent copper (Cu) diffusion. The metal caps or blocking boundaries are created at the via interfaces (i.e., between the top surface of the Cu region and the distal end of the via). In various embodiments, the blocking boundary can be placed directly underneath the via where the circuit requires a blocking boundary.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes can be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor structure, the method comprising:
   depositing an insulating layer over a semiconductor substrate;
   etching the insulating layer to form trenches for receiving a metal;
   depositing one or more sacrificial layers;
   etching portions of the one or more sacrificial layers to expose a top surface of the metal of one or more of the trenches;
   selectively depositing an electrode over the top surface of the exposed metal;
   nitridizing the electrode to form a nitride cap over the electrode;
   forming a magnetic tunnel junction (MTJ) in direct contact with a portion of a top surface of the nitride cap; and
   forming a first dielectric cap over exposed portions of the top surface of the nitride cap, the first dielectric cap in direct contact with sidewalls of the nitride cap and the electrode.

2. The method of claim 1, wherein the electrode is a metal selected from the group consisting of: cobalt (Co), ruthenium (Ru), manganese (Mn), tungsten (W), tantalum (Ta), and molybdenum (Mo).

3. The method of claim 1, wherein the metal received within the trenches is copper (Cu).

4. The method of claim 1, wherein the metal is recessed before receiving the nitride cap.

5. The method of claim 1, wherein the electrode extends along an entire surface of the metal received within the trench to create a blocking boundary directly beneath the respective MTJ.

6. The method of claim 1, wherein a block mask is deposited over the one or more sacrificial layers to separate MTJ regions from non-MTJ regions.

7. The method of claim 1, wherein a via is formed such that it aligns with the electrode forming a barrier between the MTJ and the metal.

8. A method for forming a semiconductor structure, the method comprising:
   depositing an insulating layer over a semiconductor substrate;
   etching the insulating layer to form trenches for receiving a metal;
   depositing one or more sacrificial layers;
   etching portions of the one or more sacrificial layers to expose a top surface of the metal of one or more of the trenches;
   selectively recessing the exposed metal of one or more of the trenches;
   selectively depositing an electrode within the recessed portion of the exposed metal;
   nitridizing the electrode to form a nitride cap over the electrode;
   forming a magnetic tunnel junction in direct contact with a portion of a top surface of the nitride cap; and
   forming a first dielectric cap over exposed portions of the top surface of the nitride cap, the first dielectric cap in direct contact with sidewalls of the nitride cap and the electrode.

9. The method of claim 8, wherein the electrode is a metal selected from the group consisting of: cobalt (Co), ruthenium (Ru), manganese (Mn), tungsten (W), tantalum (Ta), and molybdenum (Mo).

10. The method of claim 8, wherein the metal received within the trenches is copper (Cu).

11. The method of claim 8, wherein the metal is recessed before receiving the nitride cap.

12. The method of claim 8, wherein the electrode extends along an entire surface of the metal received within the trench to create a blocking boundary directly beneath the respective MTJ component.

13. The method of claim 8, wherein a block mask is deposited over the one or more sacrificial layers to separate MTJ regions from non-MTJ regions.

14. The method of claim 8, wherein a via is formed such that it aligns with the electrode forming a barrier between the MTJ and the metal.

* * * * *